United States Patent

Moreau et al.

[11] Patent Number: 6,161,280
[45] Date of Patent: Dec. 19, 2000

[54] METHOD FOR MANUFACTURING A DEVICE FOR BURNING OFF THERMAL ENERGY PRODUCED BY ELECTRONIC COMPONENTS EMBEDDED IN A PRINTED CIRCUIT CARD, AND RESULTING DEVICE

[75] Inventors: Emmanuel Moreau, Toulouse; Christophe Dessaux, La Française, both of France

[73] Assignee: Giat Industries, France

[21] Appl. No.: 09/242,735

[22] PCT Filed: Aug. 21, 1997

[86] PCT No.: PCT/FR97/01510

§ 371 Date: Feb. 23, 1999

§ 102(e) Date: Feb. 23, 1999

[87] PCT Pub. No.: WO98/08363

PCT Pub. Date: Feb. 26, 1998

[51] Int. Cl.[7] .................................................. H05K 3/30
[52] U.S. Cl. .............................................. 29/841; 174/15.1
[58] Field of Search .................... 29/841, 840; 174/256, 174/15.1, 252; 361/705, 715, 720

[56] References Cited

U.S. PATENT DOCUMENTS 4,974,119  11/1990  Martin .
5,095,626  3/1992  Kitamura et al. ............................ 29/827
5,403,973  4/1995  Santilli et al. .
5,738,907  4/1998  Vaccaro et al. ............................ 427/17

FOREIGN PATENT DOCUMENTS 2654890  5/1991  France .
1803395  11/1969  Germany .
3151655  7/1983  Germany .

*Primary Examiner*—Lee Young
*Assistant Examiner*—Sean Smith
*Attorney, Agent, or Firm*—Parkhurst & Wendell, L.L.P.

[57] ABSTRACT

A method for manufacturing a device to dissipate the thermal energy produced by electronic components embedded in a printed circuit card, such method consisting in depositing on the card a first layer of a first thermally conductive and electrically insulating material to cover at least the connecting tabs for the electronic components to be cooled, and putting this first layer in contact with a metallic drain connected to a thermal mass to drain the calories towards the exterior of the card, wherein the method consisting is making the drain in the form of a flexible porous metallic structure, and in depositing on the drain a second layer of a second material that adheres to the first layer through the pores of the drain to hold the latter in place on the card.

12 Claims, 2 Drawing Sheets

METHOD FOR MANUFACTURING A DEVICE FOR BURNING OFF THERMAL ENERGY PRODUCED BY ELECTRONIC COMPONENTS EMBEDDED IN A PRINTED CIRCUIT CARD, AND RESULTING DEVICE

FIELD OF THE INVENTION

The present invention relates to a method for manufacturing a device for dissipating thermal energy produced by electronic components embedded in a printed circuit card, as well as the thermal dissipation device obtained by such method.

One particularity of electronic components is that their operation causes them to over-heat, and the resulting increase in temperature tends to affect the operating reliability of such components. It is thus necessary for such thermal energy to be dissipated, but the ever-increasing density of electronic components embedded in a card in no way facilitates this thermal dissipation.

Generally speaking, the cooling of electronic components embedded in a card is provided either by convection, or by conduction.

DESCRIPTION OF THE RELATED ART

Convection cooling is obtained by the circulation of a fluid that is usually forced outside air ventilation. This solution, although efficient, requires the installation of at least one, often bulky, ventilator. Moreover, this solution is not suited to equipment that has to remain sealed-off from the external environment.

Conduction cooling consists in providing a thermal drain to evacuate the calories towards the exterior. By way of example, and as described in document FR-A-2,654,890, the thermal drain is formed of a rigid metallic plate. This plate is mounted in parallel to the card and is thermally connected to the electronic components by an element or interposed layer of a thermally conductive and electrically insulating material that is in contact firstly with the electronic components, and secondly with the metallic plate. This plate is then fastened by means of a thermal connector to a cold wall that is, more often than not, the metallic chassis whose purpose is also to hold the card.

Such a thermal dissipation device is difficult to implement, notably with regard to the contacting of the rigid metallic plate and the interposed layer, given the presence of the thermal connector that must be fastened, as must the card, to the chassis of the equipment. In such circumstances, the width of the contact surface between the interposed layer and the metallic plate will notably depend on the manufacturing accuracy of the fastening means for the card and thermal connector.

The U.S. Pat. No. 5,403,973 describes a process to close tightly under vacuum a device to protect a printed circuit card, in which the said card is introduced in a casing of plastic material, this casing being provided with a upper face adjacent to the upper face of the card and a lower face adjacent to the lower face of the card, to introduce a metallic sheet between at least one of these said upper and lower faces of the said casing and the opposite face of the card, to introduce a layer of electrically conductive material between the metallic sheet and the opposite face of the card, and to close tightly under vacuum the said casing, the metallic sheet being a dissipation device for the heat produced by the components.

BRIEF SUMMARY OF THE INVENTION

The aim of the invention is to produce a thermal dissipation device by conduction that is both simple to implement and does not require manufacturing tolerances that are as restrictive as those required by prior art.

To this end, the invention proposes a method for manufacturing a device to dissipate the thermal energy produced by electronic components embedded in a printed circuit card, such method consisting in depositing on the card a first layer of a first thermally conductive and electrically insulating material to cover at least the connecting tabs for said electronic components to be cooled, and putting this said first layer in contact with a metallic drain connected to a thermal mass to drain the calories towards the exterior of said card, wherein the method consisting in making said drain in the form of a flexible porous structure, and in depositing on said drain a second layer of a second material that adheres to said first layer through the pores of said drain to hold the latter in place on said card.

According to a preferred embodiment, the method consists in limiting the deposit thickness of said first layer so as to electrically insulate only said connecting tabs of said electronic components, which dissipate a large amount of thermal energy, and in then putting said thermal drain into contact directly with those parts of these said components that are not covered by said first layer.

To make it easier for the first and second layers to adhere to one another, the same materials are advantageously used for both layers, such as, for example, a polyurethane-based resin deposited by casting.

According to a variant of the method according to the invention, said flexible structure is made in the form of an envelope or sleeve in which the card is inserted so as to ensure electromagnetic shielding.

Generally speaking, the flexible porous metallic structure forming the thermal drain can be constituted by an open cell foam, by a band of a certain thickness having a globally lattice structure, or by at least one filament plied so as to form a volume having communicating pores or cells.

A further object of the invention is a thermal dissipation device made according to the afore-mentioned method.

According to an important advantage of the invention, the thermal drain is caught between the first and second layers, thereby enabling it to be kept in place without the need for additional fastening means.

According to another advantage of the invention, the electronic components that dissipate the most energy can be put into direct contact with the metallic drain thereby improving conduction cooling efficiency.

BRIEF DESCRIPTION OF THE DRAWINGS

Other advantages, characteristics and particulars of the invention will become apparent from the explanatory description that follows, made in reference to the appended drawings, given merely by way of example and in which.

DETAILED DESCRIPTION OF THE INVENTION

Figure 1:
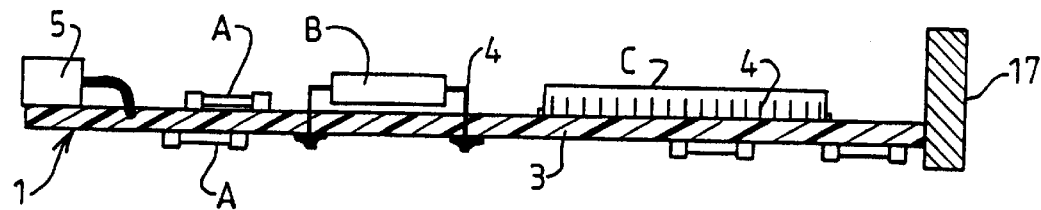
FIG. 1 is a section view of a printed circuit board that supports a set of electronic components.

In a manner known in itself, an electronic card 1 such as that illustrated in FIG. 1 comprises a substrate 3 of epoxy resin supporting a set of electronic components A, B and C, for example. These components have connecting tabs 4 that are welded onto conductive strips (not shown) deposited on the two faces of substrate 3. A connector 5 is fastened onto an edge of card 1 to provide electrical links to the exterior.

The electronic components, and in particular component B, which can be a power component, and component C, which can be an integrated circuit, dissipate a large amount of thermal energy that it is preferable to dissipate. To this end, a structure is put onto card 1 enabling such thermal energy to be dissipated according to a manufacturing method described hereafter.

Figure 2:
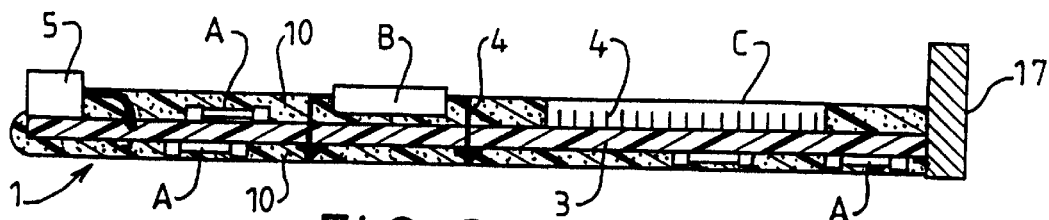
FIGS. 2 to 5 illustrate the different stages of the method according to the invention to make a device to dissipate the thermal energy produced by the electronic components of the card shown in FIG. 1, FIGS. 6 and 7 illustrate a variant of the method according to the invention.

In the first stage illustrated in FIG. 2, a first layer 10 of a first electrically insulating and thermally conducting material is deposited. In the example shown, this first layer 10 is deposited on both faces of substrate 3 of card 1, which globally means coating substrate 3 with this first layer 10. Components A, such as resistors, can be fully embedded in this first layer 10. On the contrary, according to a preferred embodiment, components B and C, which dissipate the most thermal energy, are only partially embedded in this first layer 10 but for a depth that is enough to electrically insulate connecting tabs 4 of these components B and C.

By way of example, the material used to make this first layer 10 is a resin of the polyurethane type, cast onto both faces of substrate 3 before solidifying. This first layer 10 is not necessarily of a constant thickness and its surface is not necessarily plane or even.

Figure 3:
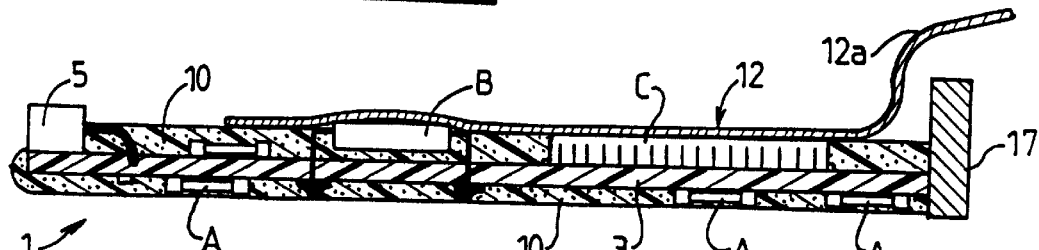

In a second stage illustrated in FIG. 3, a thermal drain 12 of a material of very good conductivity, such as metal, is put onto at least the face of substrate 3 supporting both components B and C. Drain 12 is brought into contact with first layer 10 as well as with the upper parts of components B and C, which are not covered with this first layer 10.

Thermal drain 12 is made up of a metallic structure being both flexible and porous.

The flexibility of drain 12 allows it to mould itself to the shape of the surface on which it is deposited so as to obtain the largest possible contact surface area between first layer 10, drain 12 and components B and C. Drain 12 is given dimensions such that at least one of its free ends 12a extends beyond the surface of card 1 so as not to be covered by first layer 10.

Figure 4:
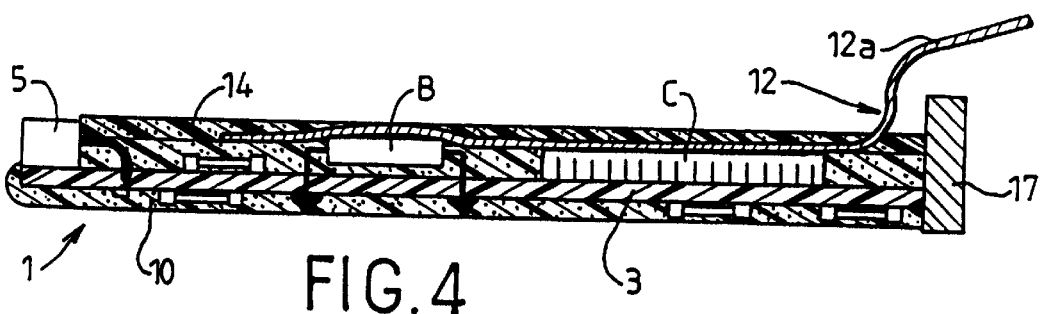

In a third stage illustrated in FIG. 4, drain 12 is set into position on card 1. To do this, a second layer 14 of a second material is cast onto drain 12 so that the porosity of drain 12 allows this second material to run through the pores of drain 12 and come into contact with first layer 10, adhering to the latter after solidification.

Advantageously, second layer 14 is made up of the same material as that used for first layer 10, so as to avoid any problems of adhesion between the two layers and having to use an intermediary linking agent.

Figure 5:
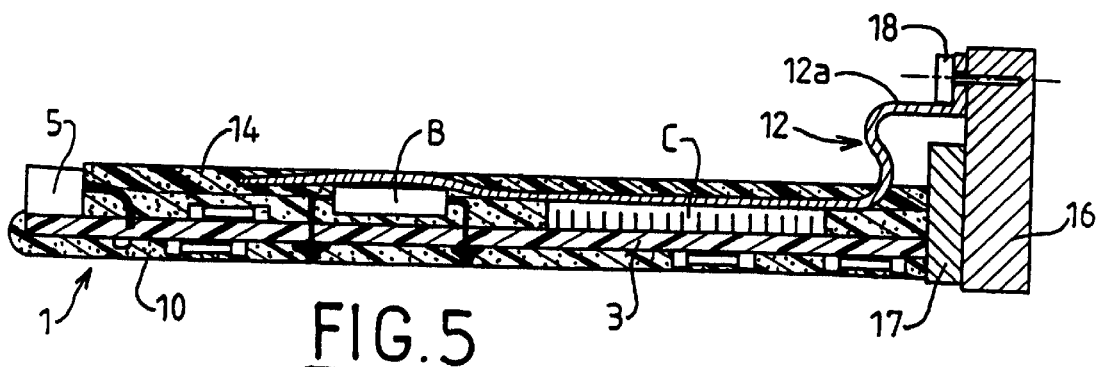

Lastly, in a fourth stage illustrated in FIG. 5, when card 1 is set into position and fastened, for example, on a metallic chassis 16 of a piece of electronic equipment by means of a fastening element 17, free end 12a of drain 12 is put into contact with a thermal mass by means of a screw 18, for example, such mass being formed, for example, of chassis 16.

Figure 6:
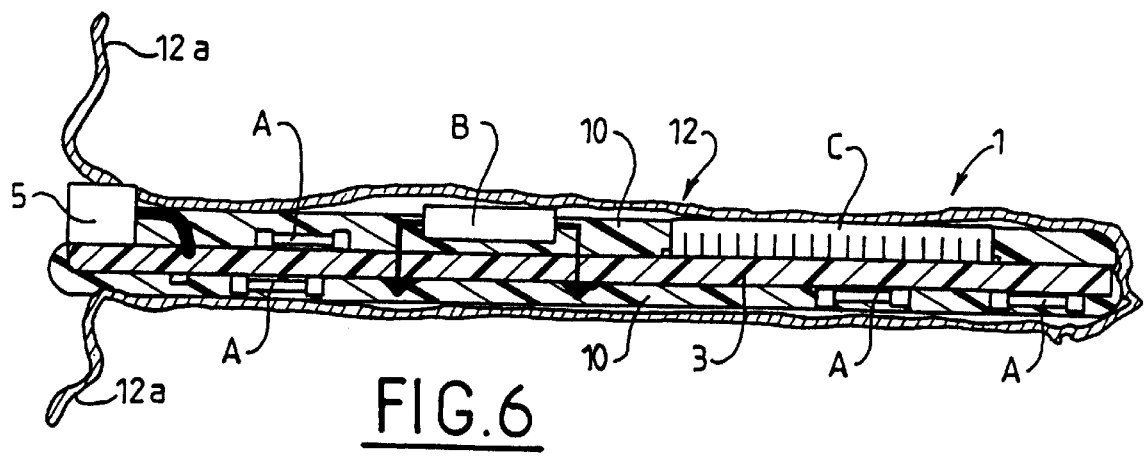
Figure 7:
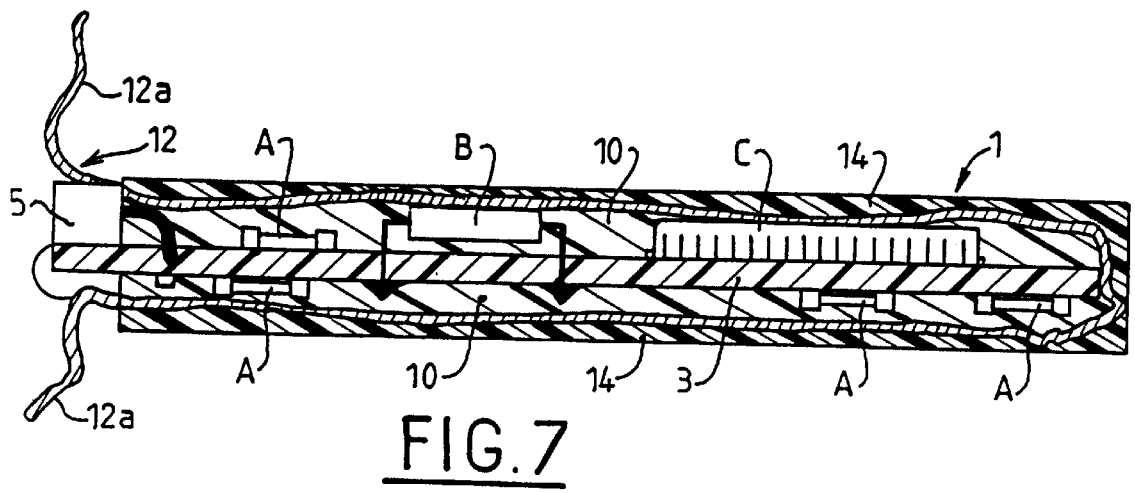

In a first variant illustrated in FIGS. 6 and 7, thermal drain 12 is formed of an envelope in the shape of a sleeve in which card A is inserted (FIG. 6). Thereafter, thermal drain 12 is coated with a second layer 14 to hold it in position (FIG. 7).

In this manufacturing variant, thermal drain 12 advantageously forms an electromagnetic shield.

Figure 8:
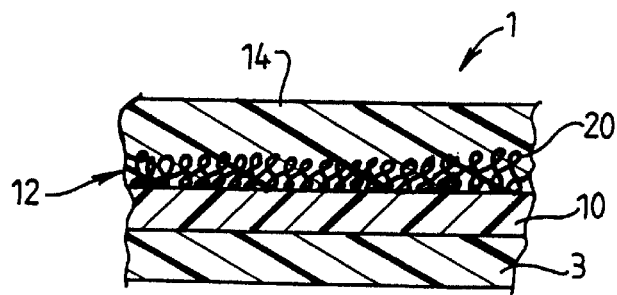
FIG. 8 is a partial section view of the card to illustrate one form of the structure of the thermal drain used to evacuate the calories dissipated by the electronic components of the card.

Lastly, FIG. 8 shows a thermal drain 12 formed of a metallic filament 20 plied so as to form a volume with communicating pores or cells through which the material constituting second layer 14 can run. As a variant, drain 12 can be constituted by a metallic foam.

What is claimed is:

1. A method for manufacturing a device to dissipate the thermal energy produced by electronic components embedded in a printed circuit card, such method consisting in depositing on said card a first layer of a first thermally conductive and electrically insulating material to cover at least the connecting tabs for the said electronic components to be cooled, and putting this said first layer in contact with a metallic drain connected to a thermal mass to drain the calories towards the exterior of the card, wherein the method consisting in making said drain in the form of a flexible porous structure, and in depositing on said drain a second layer of a second material that adheres to said first layer through the pores of said drain to hold the latter in place on said card.

2. A method according to claim 1, wherein it consists in limiting the deposit thickness of said first layer so as to insulate only said connecting tabs of said electronic components to be cooled and to put said thermal drain into contact with those parts of these said components that are not covered by the first layer.

3. A method according to claim 2, wherein it consists in using the same materials for said first and second layers.

4. A method according to claim 2, wherein it consists in depositing said first and second layers by casting.

5. A method according to claim 1, wherein it consists in making said flexible structure of said drain in the form of an envelope or sleeve in which said card is inserted so as to also ensure electromagnetic shielding.

6. A device for dissipating thermal energy produced by electronic components embedded in a printed circuit card, said device comprising a first layer of a thermally conductive and electrically insulating material that is deposited on said card to insulate at least the connecting tabs of said electronic components to be cooled, and a metallic drain in contact with said first layer and connected to a thermal mass to drain the calories towards the exterior, wherein said drain is a flexible porous structure, and wherein said device also comprises a second layer of a second material that is deposited on said drain and that adheres to said first layer through the pores of said drain.

7. A device according to claim 6, wherein said drain is in direct contact with certain of said components to be cooled.

8. A device according to claim 6, wherein said drain is constituted by an open cell metallic foam.

9. A device according to claim 6, wherein said drain is made in the form of a band of a thickness having a lattice structure.

10. A device according to claim 6, wherein said drain is made of at least one filament plied so as to form a volume having communicating pores or cells.

11. A device according to claim 10, wherein said drain is constituted by an envelope or sleeve in which said card is inserted so as to also form an electromagnetic shield.

12. A device according to claim 11, wherein said materials constituting said first and second layers are the same, a polyurethane type resin for example.

* * * * *